United States Patent [19]

Lerouge

[11] Patent Number: 4,488,253

[45] Date of Patent: Dec. 11, 1984

[54] PARALLEL COUNTER AND APPLICATION TO BINARY ADDERS

[75] Inventor: Claude P. H. Lerouge, Maurepas, France

[73] Assignee: ITT Industries, Inc., New York, N.Y.

[21] Appl. No.: 373,458

[22] Filed: Apr. 30, 1982

[30] Foreign Application Priority Data

May 8, 1981 [FR] France .................................. 81 09166

[51] Int. Cl.³ ................................................ G06F 7/50
[52] U.S. Cl. .................................................... 364/786
[58] Field of Search ............... 364/786, 784, 777, 768, 364/715

[56] References Cited

U.S. PATENT DOCUMENTS

| | | | |
|---|---|---|---|
| 3,603,776 | 9/1971 | Weinberger | 364/786 |
| 3,636,334 | 1/1972 | Sroboda | 364/786 |
| 3,711,692 | 1/1973 | Batcher | 364/786 |
| 3,723,715 | 3/1973 | Chen et al. | 364/786 |
| 4,189,716 | 2/1980 | Krambeck | 364/715 |

OTHER PUBLICATIONS

Singh et al., "Multiple Operand Addition and Multiplication" *IEEE Trans. on Computers*, vol. C-22, No. 2, Feb. 1973, pp. 113-120.

*Primary Examiner*—David H. Malzahn
*Attorney, Agent, or Firm*—James B. Raden; William J. Michals

[57] ABSTRACT

A counter comprising MOS transistor cells providing a tree like network. The logic value 1 is shifted to the left (bits of highest weight or rank) as many times as there are input binary variables with the logic value 1. The corresponding output is then at level 1 and all the other outputs are at logic level 0. An adder is obtained by providing a NOR gate decoding arrangement connected to the outputs of the counter.

10 Claims, 5 Drawing Figures

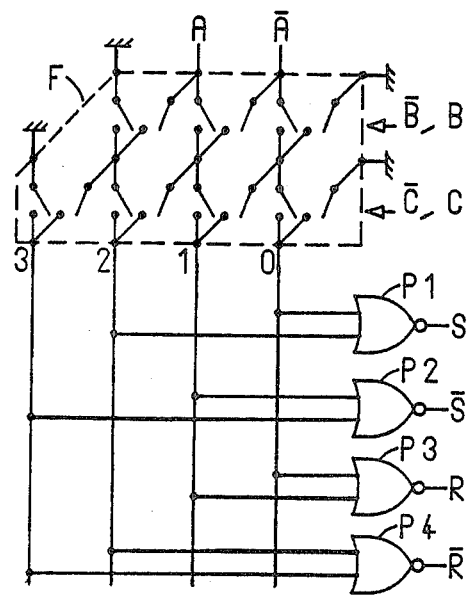
FIG.4
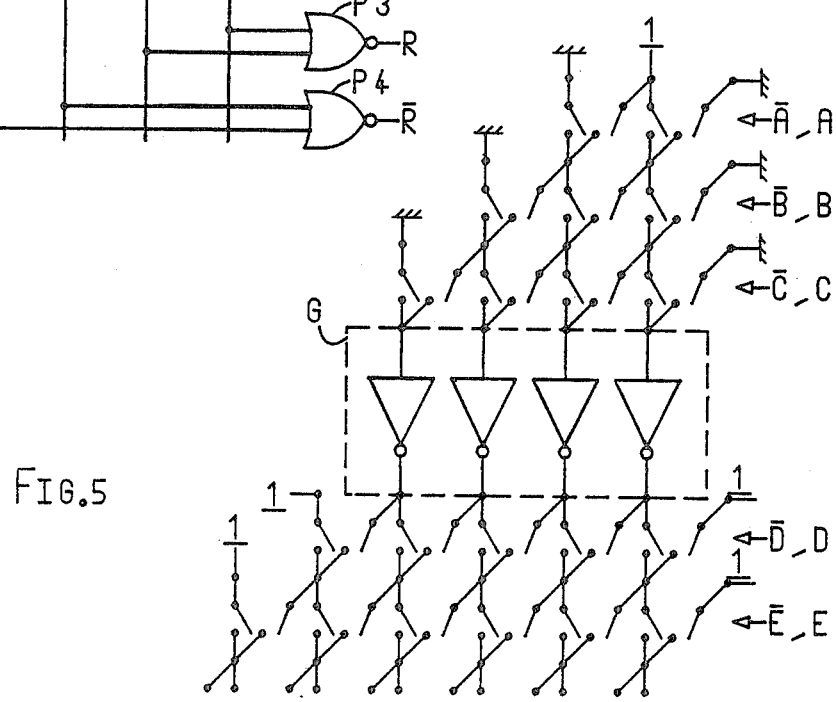
FIG.5
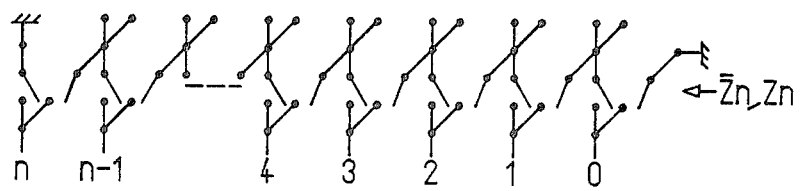

PARALLEL COUNTER AND APPLICATION TO BINARY ADDERS

BACKGROUND OF THE INVENTION

The present invention relates to a parallel counter constructed as an integrated circuit using MOS transistors, with n inputs and (n+1) outputs and an application of this counter in the construction of a binary adder.

The possibility of an adder permitting the addition of a large number of bits in parallel is of particular interest for the construction of a multiplier in which it is necessary to add in parallel several binary elements representing the partial products of the same order. In MOS logic, that is to say in the case of integrated logic circuits using MOS transistors, it is customary to use three-input two-output adders. The problems of carry propagation and the algorithms used to overcome the delays introduced by the time required for carry propagation are well known. However, the logic information will in any case have to pass through a certain number of gates, usually EXCLUSIVE OR gates, each containing several of these MOS transistors, and its speed of operation will be greatly affected.

SUMMARY OF THE INVENTION

Therefore, an object of the present invention is to provide a counter having n inputs and (n+1) outputs, in which, in each stage, the information passes through only one MOS transistor, receives n binary variables at its n inputs and in which only the output thereof whose rank corresponds to the number of binary variables at the logic 1 level furnishes a logic 1 output signal.

Parallel counters of this type exist, with n inputs and (n+1) outputs, based on relay logic. These counters are formed from a "tree-like" arrangement. Each two-position contact, controlled by a given relay, routes a data item to one or the other of the branches which it controls. All contacts at the same level of the tree are controlled by the same relay, which is itself controlled by one of the n input variables. However, the problems in these relay-logic circuits are different than those using MOS logic systems, if only because of their different operating speeds, and the same is true for the requirements imposed on such circuits, for example, such as the need to "ground" in order to obtain a logic zero.

A feature of the present invention is the provision of a parallel counter comprising n inputs and (n+1) outputs each having a different rank numbered from 0 to n in an integrated circuit utilizing MOS transfer transistors responding to n binary variables each coupled to a different one of the n inputs to provide a logic 1 output at that one of said (n+1) outputs whose rank corresponds to the number of the n binary variables having a logic 1 level; and a truncated triangular-shaped network of a plurality of V-shaped elementary cells, each having two inputs and one output, whose right-hand branch includes a first MOS transistor controlled by an associated one of the n binary variables and whose left-hand branch includes a second MOS transistor controlled by the complement of the associated one of the n binary variables, the network having a first line including two of the elementary cells controlled by a first of the n binary variables and having their facing inputs electrically connected together to provide a first double input, a second line including three of the elementary cells controlled by a second of the n binary variables and each having their facing inputs electrically connected together to provide two double inputs connected to corresponding outputs of the first line, an $i^{th}$ line including (i+1) of the elementary cells controlled by an $i^{th}$ of the n binary variable and each having their facing inputs electrically connected together to provide i double inputs connected to i corresponding outputs of the preceding line and whose (i+1) outputs number from left to right from 0 to i are connected to the (i+1) corresponding double inputs of the following line, and a $n^{th}$ line including (n+1) of the elementary cells controlled by the $n^{th}$ of the n binary variables and each having their facing inputs electrically connected together to provide n double inputs connected to n corresponding outputs of the preceding line and whose (n+1) outputs correspond to the (n+1) outputs of the counter, the first double input receiving a logic 1 level and all single inputs of the elementary cells of all of the lines receiving a logic 0 level to provide the logic 1 level at the one of the (n+1) outputs with a logic 0 level appearing at all others of the (n+1) outputs.

BRIEF DESCRIPTION OF THE DRAWING

Above-mentioned and other features and objects of this invention will become more apparent by reference to the following description taken in conjunction with the accompanying drawing, in which:

FIG. 4 is a schematic diagram of a variant of FIG. 3 in the case of a three-input counter and its use in a binary adder; and FIG. 5 is a schematic diagram of a counter in accordance with FIG. 3 with regeneration by inverter circuits.

DESCRIPTION OF THE PREFERRED EMBODIMENT

Figure 1:
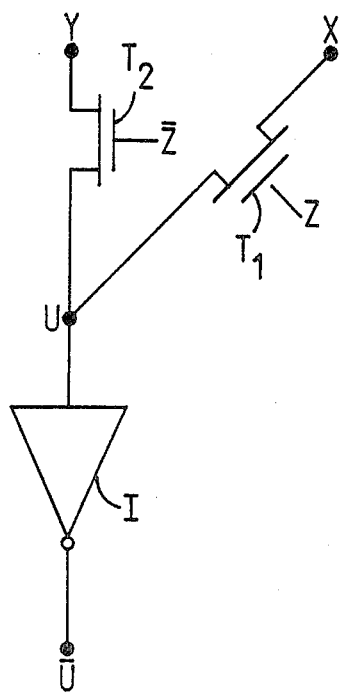
FIG. 1 is a schematic diagram of a V-shaped MOS-transistor elementary cell.

FIG. 1 shows an unsymmetrical V-shaped elementary cell using identical MOS transfer transistors in each branch but in which the first transistor $T_1$, placed in the oblique branch or right-hand branch of the V, is controlled by the binary variable Z, and in which the transistor $T_2$, placed in the vertical or left-hand branch of the V, is controlled by the complement $\overline{Z}$ of this binary variable. If the binary control variable Z is at the logic 1 level, $\overline{Z}$ being at the logic 0 level, transistor $T_1$ conducts and transistor $T_2$ is cut off. The cell will then reproduce at U the binary variable X. Conversely, if the variable Z is a logic 0, the cell will reproduce at U the binary variable Y. However, this transfer of binary elements from one of the inputs to the output occurs with some distortion due to the stray capacities and resistances of the MOS transistors. If it is desired to place several of these cells, one after another, the outputs of these cells will have to be regularly regenerated. This can be done by means of an inverter circuit I whose output is then certain to be either a logic 0 or 1.

Figure 2:
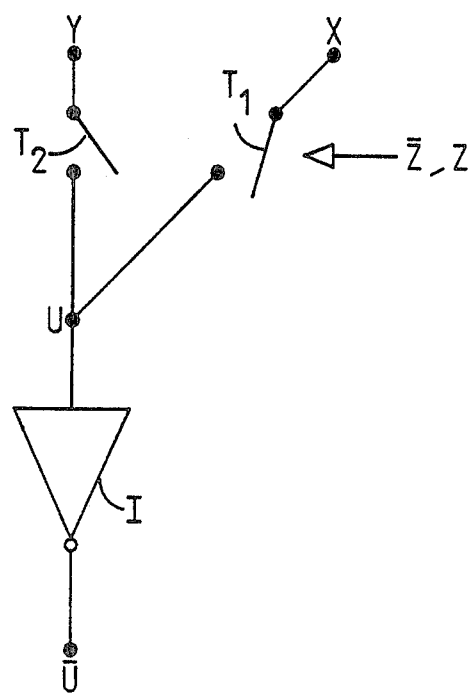
FIG. 2 is an equivalent circuit diagram of the cell shown in FIG. 1.
Figure 3:
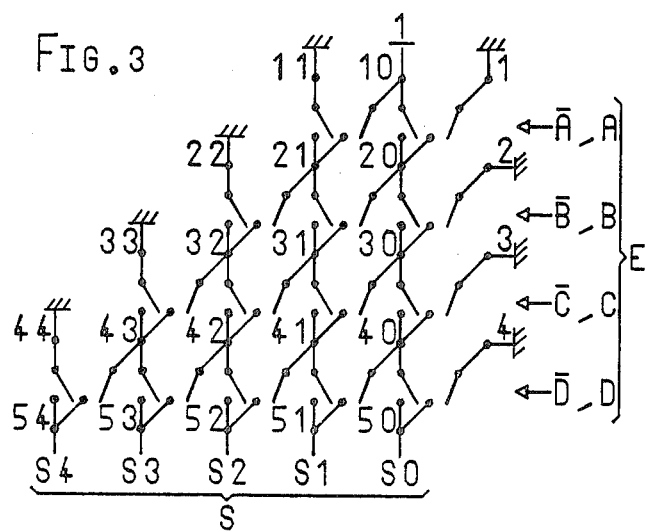
FIG. 3 is a schematic diagram of a network including a plurality of the cells of FIG. 1 constituting a four-input five-output counter.

A parallel counter is shown in FIG. 3 with 4 inputs E and (4+1) outputs S in accordance with the principles of the present invention. This counter is composed of a plurality of the elementary cells of FIG. 1, each of which is illustrated in the equivalent circuit configuration of FIG. 2, laid out in a truncated triangular-shaped network. The first line or row of cells on the first stage is composed of two such cells controlled by the binary input variable A: the oblique branches of the V's are controlled by the variable A and the vertical branches are controlled by the complement $\overline{A}$ of this variable. The facing inputs of the cells of the first line are connected electrically and constitute a so-called double input 10, at the junction point 10 of rank 0 and line 1. The other inputs 1 and 11 constitute single inputs: the rank of input 1 is not counted and the input 11 is a single input of line 1 and rank 1. The junction points 20 and 21, which constitute the outputs of the first line as well as the double inputs of the second line, are designated by a number whose unit's digit represents the rank and whose ten's digit represents the number of the line on which they are the inputs. The second line, controlled in the same way by the second input variable B, contains one cell more than the first line. The facing inputs of each of these cells are connected and constitute double inputs 20 and 21; the single inputs 2 and 22 of the second line lie in the uncounted rank and rank 2, respectively. The outputs of the second line 30, 31,32 are numbered from 0 to 2 (0, 1 and 2 constituting the rank of the output).

With each line having one elementary cell more than the preceding line, the fourth and last line therefore has six inputs, of which four are double 40, 41, 42, 43 and two are single 4 and 44, and five outputs 50, 51, 52, 53, 54 of rank 0 to 4.

The sole double input 10 of the first line of elementary cells receives the logic 1 level, and all the single inputs of the cells of all the lines receive the logic 0 level, so that if all the binary input variables are in the 0 state, then all the outputs of cells of rank 0 are in the 1 state and all the other outputs of cells of rank 1 or higher are in the 0 state.

The operation of the four-input counter can then be explained in the following manner.

If none of the input variables is in the 1 state, the logic 1 level furnished at 10, as well as the logic 0 levels furnished at 11, 22, 33, 44, will be transmitted vertically without change of rank: the output SO will therefore be in the 1 state, the outputs S1, S2, S3, S4, of higher ranks, will be in the 0 state. Each time an additional input variable is in the 1 state, the corresponding line of cells will shift the logic 1, as well as all of the logic 0's, located at its left, by one rank to the left. This same line of cells will also introduce, by means of one of the inputs 1, 2, 3, 4, a supplementary 0 level which will be transmitted to the output, with or without change of rank in subsequent lines and will permit setting to zero all the outputs of rank less than the number of input variables in the 1 state.

If we consider the first cell of the first line, whose inputs are 1 and 10 and the output 20 furnishing the binary variable $U_{20}$, and the second cell of the first line, whose inputs are 10 and 11 and the output 21 furnishing $U_{21}$, both controlled by the binary variable A, we see that the variables at the outputs are written:

$$U_{20} = 0A + 1\overline{A} = \overline{A}$$

$$U_{21} = 1A + 0\overline{A} = A$$

We can therefore eliminate these first two cells and send $\overline{A}$ and A directly to 20 and 21, respectively. We thus obtain, retaining only three inputs, the binary counter F shown in FIG. 4 in connection with its use in a three-input two-output (3, 2) adder utilizing the three input four-output counter F and four NOR gates $P_1$ to $P_4$ which furnish the binary sum element S and the binary carry element R from the addition of the three input variables A, B, C, as well as their complements $\overline{S}$ and $\overline{R}$. It is possible to construct any type of adder (3, 2), (4, 3), (5, 3), (6, 3), (7, 3), with some, such as (3, 2) and (7, 3), being used in an optimum or "saturated" mode.

FIG. 5 shows a counter with n inputs and (n+1) outputs with regeneration of levels every time the information has passed through three cells. This relatively small number of three cells was chosen to simplify the drawing, but the number k of lines after which regeneration should be introduced can be greater. The logic levels are regenerated by means of an additional line G of inverters. Beyond this line, the single inputs of the end cells will have to receive a logic 1 level if they received a logic 0 in the preceding lines and vice versa. An even number of such additional lines should be added between the first line and the output of the counter if it is not desired that the counter outputs be complemented. This counter with n inputs and (n+1) outputs can obviously be used in connection with an n-input adder by generalizing the decoding principle used for the three-input counter of FIG. 4.

Although this invention has been described in connection with particular examples, the invention is clearly not limited to these examples and is capable of modifications or variants still lying within its scope. In particular, one could use lines of V-shaped cells controlled by variables to which a weight of $2^u$ units is assigned. These would cause the binary informations to jump $\underline{u}$ ranks provided that the number of outputs and the number of grounds are suitably adjusted.

While I have described above the principles of my invention in connection with specific apparatus, it is to be clearly understood that this description is made only by way of example and not as a limitation to the scope of my invention as set forth in the objects thereof and in the accompanying claims.

I claim:

1. A parallel counter for providing an output signal indicative of the number of applied individual input signals having a given logic state, comprising:
   a first current source for providing a logic signal of one state;
   a second current source for providing a logic signal of opposite state;
   at least first and second data input terminals;
   at least first, second and third data output terminals;
   at least first, second, third, fourth and fifth switch circuits, each of said circuits including a pair of solid state switch devices, each of said switch devices including a pair of principal electrodes and a control electrode, said control electrodes being connected to a common switch circuit input terminal and being adapted to operate in opposite conduction states in response to a control signal applied to said switch circuit control terminal;
   said principal electrodes of said first switch device in each of said switch circuits being connected between a switch circuit input terminal and a switch circuit output terminal, said principal electrodes of said second switch device being connected between a switch circuit branch terminal and said switch circuit output terminal;

the input terminal of said first switch circuit being connected to said first current source, the output terminal of said first switch circuit being connected to the input terminal of said second switch circuit, the output terminal of said second switch circuit being connected to said first data output terminal, the input terminal of said third switch circuit being connected to said second current source, the output terminal of said third switch circuit being connected to the input terminal of said fourth switch circuit, the output terminal of said fourth switch circuit being connected to said second data output terminal, the input terminal of said fifth switch circuit being connected to said second current source, the output terminal of said fifth switch circuit being connected to said third data output terminal, the branch input terminals of said first and second switch circuits being connected to said second current source, the branch input terminal of said third switch circuit being connected to said first current source, the branch input terminal of said fourth switch circuit being connected to the output terminal of said first switch circuit, the branch input terminal of said fifth switch circuit being connected to the output terminal of said third switch circuit;

the control terminals of said first and third switch circuits being connected to said first data input terminal;

the control terminals of said second, fourth and fifth switch circuits being connected to said second data input terminal;

whereby a logic signal is produced at said output terminals indicative of the number of input signals of a predetermined logic state applied to said data input terminals.

2. A parallel counter as defined in claim 1 wherein said solid state switch devices comprise MOS devices.

3. A parallel counter as defined in claim 2 further comprising means for regenerating said logic signals.

4. A parallel counter as defined in claim 3 wherein said means comprise one or more signal invertors.

5. A parallel counter as defined in claim 4 further comprising a plurality of logic gates, having input terminals connected to said data output circuits as to provide a binary signal indicative of the number of input signals of a predetermined logic state applied to said data input terminals.

6. A parallel counter for providing an output signal indicative of the number of applied individual input signals having a given logic state, comprising:

at least first second and third data input terminals on which first, second and third input signals are applied;

at least first, second, third and fourth data output terminals;

at least first, second, third, fourth, fifth, sixth and seventh switch circuits, each of said circuits including a pair of solid state switch devices, each of said switch devices including a pair of principal electrodes and a control electrode, said control electrodes being connected to a common switch circuit input terminal and being adapted to operate in opposite conduction states in response to a control signal applied to said switch circuit control terminal;

said principal electrodes of said first switch device in each of said switch circuits being connected between a switch circuit input terminal and a switch circuit output terminal, said principal electrodes of said second switch device being connected between a switch circuit branch terminal and said switch circuit output terminal;

the input terminal of said first switch circuit being coupled to said first data input terminal as to provide the compliment of the signal thereon to said first switch circuit, the output terminal of said first switch circuit being connected to the input terminal of said second switch circuit, the output terminal of said second switch terminal being connected to said first data output terminal, the input terminal of said third switch circuit being connected to said first data input as to provide the signal thereon to said third switch circuit, the output terminal of said third switch circuit being connected to the input terminal of said fourth switch circuit, the output terminal of said fourth switch circuit being connected to said second data output terminal, the input terminal of said fifth switch circuit being connected to circuit ground, the output terminal of said fifth switch circuit being connected to the input of said sixth switch circuit, the output terminal of said sixth switch circuit being connected to said third data output terminal, the input terminal of said seventh switch circuit being connected to circuit ground, the output of said seventh switch circuit being connected to said fourth data output terminal, the branch input terminals of said first and second switch circuits being connected to circuit ground, the branch input terminal of said third switch circuit being connected to said input terminal of said first switch circuit, the branch input terminal of said fourth switch circuit being connected to said output terminal of said first switch circuit, the branch input terminal of said fifth switch circuit being connected to said input terminal of said third switch circuit, the branch input terminal of said sixth switch circuit being connected to said output terminal of said third switch circuit, the branch input terminal of said seventh switch circuit being connected to said output terminal of said fifth switch circuit;

the control terminals of said first, third and fifth switch circuits being connected to said second data input terminal;

the control terminals of said second, fourth, sixth and seventh circuits being connected to said third data input terminal, whereby a logic signal is produced at said output terminals indicative of the number of input signals of a predetermined logic state applied to said data input terminals.

7. A parallel counter as defined in claim 6 wherein said solid state switch devices comprise MOS devices.

8. A parallel counter as defined in claim 7 further comprising means for regenerating said logic signals.

9. A parallel counter as defined in claim 8 wherein said means comprise one or more signal inverters.

10. A parallel counter as defined in claim 9 further comprising a plurality of logic gates, having input terminals connected to said data output terminals as to provide a binary signal indicative of the number of input signals of a predetermined logic state applied to said data input terminals.

* * * * *